United States Patent
Kornblum et al.

(10) Patent No.: US 6,621,354 B1
(45) Date of Patent: *Sep. 16, 2003

(54) FEEDBACK METHODS AND SYSTEMS FOR RAPID SWITCHING OF OSCILLATOR FREQUENCIES

(75) Inventors: John J. Kornblum, Greensboro, NC (US); David T. Crook, Summerfield, NC (US)

(73) Assignee: Analog Devices, Inc., Norwood, MA (US)

(*) Notice: Subject to any disclaimer, the term of this patent is extended or adjusted under 35 U.S.C. 154(b) by 87 days.

This patent is subject to a terminal disclaimer.

(21) Appl. No.: 09/975,926

(22) Filed: Oct. 12, 2001

Related U.S. Application Data

(60) Provisional application No. 60/305,812, filed on Jul. 16, 2001.

(51) Int. Cl.[7] .................................................. H03L 7/10
(52) U.S. Cl. ............................ 331/14; 331/1 A; 331/16; 331/17; 331/18; 331/25; 331/DIG. 2; 327/156; 327/157; 327/159
(58) Field of Search ............................. 331/1 A, 4, 8, 331/10, 11, 14, 16, 17, 18, 25, 34, DIG. 2; 327/156–159; 332/127; 360/51; 375/376; 455/260

(56) References Cited

U.S. PATENT DOCUMENTS

| | | | | |
|---|---|---|---|---|
| 3,638,135 A | * | 1/1972 | Stover | 331/14 |
| 4,749,961 A | * | 6/1988 | Kato et al. | 331/14 |
| 6,222,421 B1 | | 4/2001 | Klyose | |
| 6,252,466 B1 | | 6/2001 | Kawamura | |
| 6,342,818 B1 | * | 1/2002 | Segawa et al. | 331/14 |
| 6,522,206 B1 | * | 2/2003 | Kornblum et al. | 331/1 A |
| 6,549,079 B1 | * | 4/2003 | Crook | 331/17 |

OTHER PUBLICATIONS

Byrd, David, et al., Application Note 1000, National Semiconductor Corporation, Jul., 1995, pp. 1–5 "A Fast Locking Scheme For PLC Frequency Synthesis".
LM2306 / LMX2316 / LMX2326 Low Power Frequency Synthesizer Data Sheet, National Semiconductor Corporation, Apr., 2001, p. 1–18.

* cited by examiner

*Primary Examiner*—David C. Mis
(74) *Attorney, Agent, or Firm*—Koppel, Jacobs, Patrick & Heybl

(57) ABSTRACT

Feedback methods and systems are provided to achieve rapid switching of oscillator frequencies without compromising operational feedback loop bandwidths that filter out spurious tones and phase noise to thereby enhance loop spectral and noise performance. The methods respond to frequency changes in a reference signal by providing an open-loop drive current to drive a feedback signal towards the reference signal. The drive current is terminated and the feedback control loop closed when the feedback signal is within a predetermined acquisition range of the reference signal. Preferably, the closed loop is initially configured with a first feedback bandwidth and is subsequently reconfigured with a second steady-state feedback bandwidth that is less than the first feedback bandwidth. The invention also provides a feedback control system that practices the invention's methods

30 Claims, 5 Drawing Sheets

FEEDBACK METHODS AND SYSTEMS FOR RAPID SWITCHING OF OSCILLATOR FREQUENCIES

CROSS REFERENCES TO RELATED APPLICATIONS

This application claims the benefit of U.S. Provisional Application Serial No. 60/305,812 filed Jul. 16, 2001.

BACKGROUND OF THE INVENTION

1. Field of the Invention

The present invention relates generally to feedback control systems and, more particularly, to phase-locked loops.

2. Description of the Related Art

A phase-locked loop is a particular type of feedback control system that maintains an output signal in a specific phase relationship with a reference signal. Phase-locked loops are vital parts of a wide variety of electronic systems (e.g., frequency synthesizers, analog and digital modulators, clock recovery circuits and direct digital synthesizers) and the basic structure of conventional phase-locked loops has been described (e.g., see U.S. Pat. Nos. 6,222,421 and 6,252,466 respectively issued Apr. 24, 2001 and Jun. 26, 2001).

Conflicting demands are placed on the selection of a loop bandwidth for a phase-locked loop. The loop bandwidth is preferably set low to filter out input-related spurious tones and phase noise to thereby meet required system spectral and noise performances. The loop bandwidth, however, is preferably set high to achieve fast switching time in response to a frequency change of the reference signal. Accordingly, the selection of loop bandwidth has typically been a compromise which degrades one or more phase-locked loop performance parameters.

SUMMARY OF THE INVENTION

The present invention is directed to feedback methods and systems that achieve rapid switching of oscillator frequencies without compromising operational feedback loop bandwidths that filter out spurious tones and phase noise to thereby enhance loop spectral and noise performance.

These goals are realized with feedback methods that respond to frequency changes in a reference signal by:

a) providing an open-loop drive current to drive a feedback signal towards the reference signal, b) detecting that the feedback signal is within a predetermined acquisition range of the reference signal; and c) terminating the drive current and closing the feedback control loop to lock the feedback signal to the reference signal.

In an embodiment of the invention, the closed loop is initially configured with a first feedback bandwidth and is subsequently reconfigured with a second steady-state feedback bandwidth that is less than the first feedback bandwidth.

The invention also provides a feedback control systems that practice the invention's methods The novel features of the invention are set forth with particularity in the appended claims. The invention will be best understood from the following description when read in conjunction with the accompanying drawings.

DETAILED DESCRIPTION OF THE INVENTION

Figure 1:
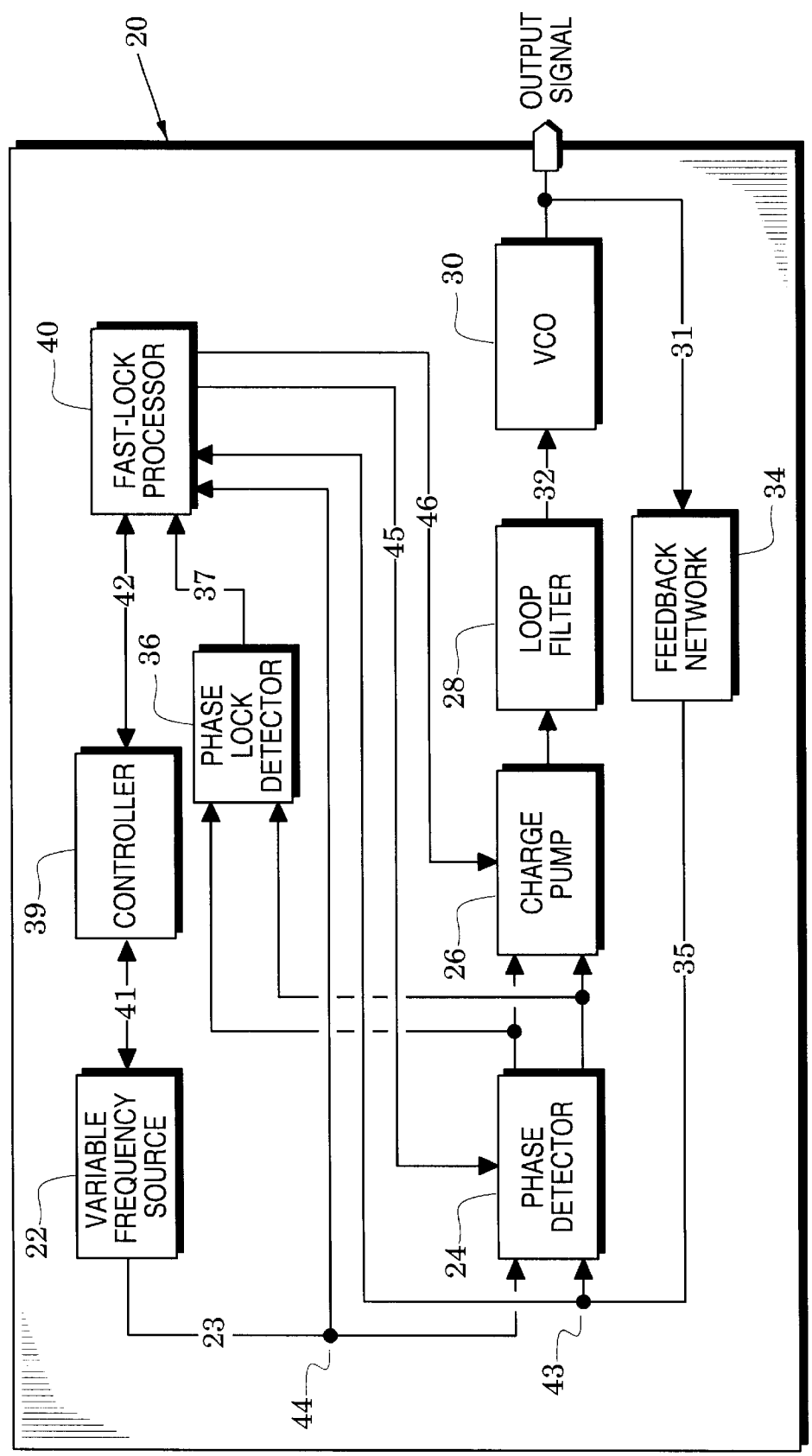
FIG. 1 is a block diagram of a feedback control system of the present invention.

Methods and systems of the present invention enhance the switching times of feedback control systems without degrading their locked operational performance. The methods of the invention can be practiced with a feedback control system embodiment 20 that is shown in FIG. 1.

In this figure, a variable-frequency source 22 (e.g., a direct digital synthesizer, a fast hopping wide-loop phase-locked loop or other fast-switching frequency source) provides a loop reference signal 23 to a phase detector 24. A charge pump 26 provides current drive signals to a loop filter 28 in response to signals from the phase detector. A voltage-controlled oscillator (VCO) 30 provides a system output signal 31 whose frequency corresponds to a voltage signal 32 that is delivered from the loop filter. The loop output signal is passed through a feedback network 34 (e.g., a frequency divider or a mixer) and delivered as a feedback signal 35 to the phase detector 24 for comparison to the loop reference signal 23.

The output signal of the phase detector corresponds to the phase difference between the loop reference signal 23 and the feedback signal 35 and the negative feedback action of the loop urges the VCO's output signal to an output frequency wherein it is phase-locked to the reference signal 23 from the variable frequency source 22. In this locked operational mode, the charge pump 26 responds to the phase detector 24 and provides currents that charge and discharge capacitive elements of the loop filter 28 as required to maintain phase lock between the VCO's feedback signal 35 and the reference signal 23.

System 20 also includes a phase-lock detector 36 that provides a monitor signal 37 in response to the output signal of the phase detector 24. A controller 39 provides control signals 41 to the variable frequency source 22. Finally, a fast-lock processor 40 responds to the monitor signal 37, to control signals 42 from the controller 39 and to signals at input nodes 43 and 44 of the phase detector 24 and, in response, provides state control signals 45 and 46 to the phase detector 24 and the charge pump 26.

In operation of the feedback control system 20 of FIG. 1, the controller 39 retains knowledge of the current loop frequency and receives knowledge (e.g., from the variable frequency source 22 or from an external source) of a subsequent destination loop frequency or the controller itself commands the destination frequency via the control signals 41. Thus, the controller 39 also has information on the direction of the subsequent frequency change which it communicates to the fast-lock processor 40 via the control signals 42. In response, the variable frequency source 22 provides a current reference signal that has the current frequency and subsequently provides a subsequent reference signal that has a different destination frequency.

Prior to provision of the subsequent reference signal, the phase detector 24 compares the phase of the feedback signal 35 on node 43 with the phase of the current reference signal 23 on node 44 and, in response, generates a control signal. In response to this control signal, the charge pump 26 supplies currents to the loop filter 28 to thereby provide a VCO control voltage that maintains phase lock between the VCO's output signal 31 and the reference signal 23.

Upon initiation of the subsequent reference signal, the phase detector 24 generates a phase error signal that is detected by the phase-lock detector 36 which alerts the fast-lock processor 40 (via the monitor signal 37) to the fact that the loop is no longer locked. In one method embodiment of the invention, the fast-lock processor 40 immediately takes over control of the control loop and effectively "opens" the loop. The loop is "opened" in that it no longer responds to phase-difference signals that are produced by the phase detector 24.

Instead, the fast-lock processor 40 (knowing the direction of the required frequency change) effectively turns off (via state control signals 45) output drivers of the phase detector 24 (e.g., with transistor switches or gates) and subsequently initiates drive currents in the charge pump 26 to thereby rapidly urge the VCO 30 in the appropriate frequency direction. In particular, the fast-lock processor 40 controls (via state control signals 46) the direction and amplitude of the drive currents which are sent from the charge pump 26 to the loop filter 28. The magnitude of the drive current level is programmable (e.g., in response to control signals 42 from the controller 39).

A predetermined magnitude and polarity of drive current is thereby sent to the loop filter 28 whose compensation capacitors charge (or discharge) at a rate that is dependent on the programmed drive current and on parameter values of capacitor elements of the loop filter 28. In response, the frequency of the VCO 30 is rapidly driven towards the destination frequency.

While these processes are occurring, the frequency being fed back from the VCO 30 to the phase detector node 43 is compared in the fast-lock processor 40 to the destination frequency of the subsequent reference signal 23 at phase detector node 44. Thus, a frequency detection loop through the fast-lock processor is effectively enabled as the phase detection loop through the phase detector 24 is disabled. During this time, the fast-lock processor 40 monitors the frequency difference between the nodes 43 and 44 and, when the frequency difference is within a predetermined acquisition range, restores (via state control signals 45) control of the feedback loop to the phase detector (i.e., returns the system 20 to its closed-loop state). The control loop is thus "closed" and now responds to phase-difference signals that are produced by the phase detector 24. The acquisition range is preferably chosen as that frequency range (sometimes referred to as a lock range) within which a phase-locked loop locks within one beat note (i.e., one period) of a difference frequency between the feedback and reference frequencies.

When the VCO 30 is within the predetermined acquisition range, the feedback control loop can pull the VCO into phase lock with the subsequent reference signal. At this time, the fast-lock processor 40 terminates the open-loop drive currents that were urging the VCO towards the destination frequency and closes the control loop by returning control of the charge pump 26 to the phase detector 24.

In an embodiment of the invention, the fast-lock processor 40 initially modifies the charge pump 26 (e.g., with transistor switches or gates, current sources and/or current mirrors) to have an increased transfer function (relative to its steady-state transfer function). In particular, the charge pump is modified (via state control signals 46) to increase its output currents in response to corresponding control signals from the phase detector 24.

The increased transfer function modifies the loop transfer function so as to temporarily increase the bandwidth of the feedback control loop above its intended steady-state operational bandwidth which is generally chosen to enhance steady-state loop characteristics (e.g., rejection of spurious signals). The wider loop bandwidth substantially reduces (relative to the steady-state bandwidth) the time for the control loop to pull the VCO 30 into final phase lock. The charge pump currents during this operational state are programmable (therefore, the loop bandwidth is programmable) and may be set by control signals 42 from the controller 39 and enabled by the fast-lock processor 40 with appropriate signals to the phase detector 24 and charge pump 26 (via state control signals 45 and 46).

The phase lock detector 24 continues to monitor the wide loop bandwidth phase error (as indicated by the phase detector output which is typically a pulse-width modulated signal) as it reduces to a predetermined magnitude. When this level is reached, the phase lock detector 36 signals the fast-lock processor 40 which, in turn, reduces (via state control signals 46) the transfer function of the charge pump 26 to its steady-state value. These transitions from an open-loop state to a wide-bandwidth, closed-loop state and finally to a steady-state narrow-bandwidth, closed-loop state essentially constitutes an adaptive loop bandwidth method which enhances rapid switching of oscillator frequencies and also enhances closed-loop performance parameters.

Figure 2:
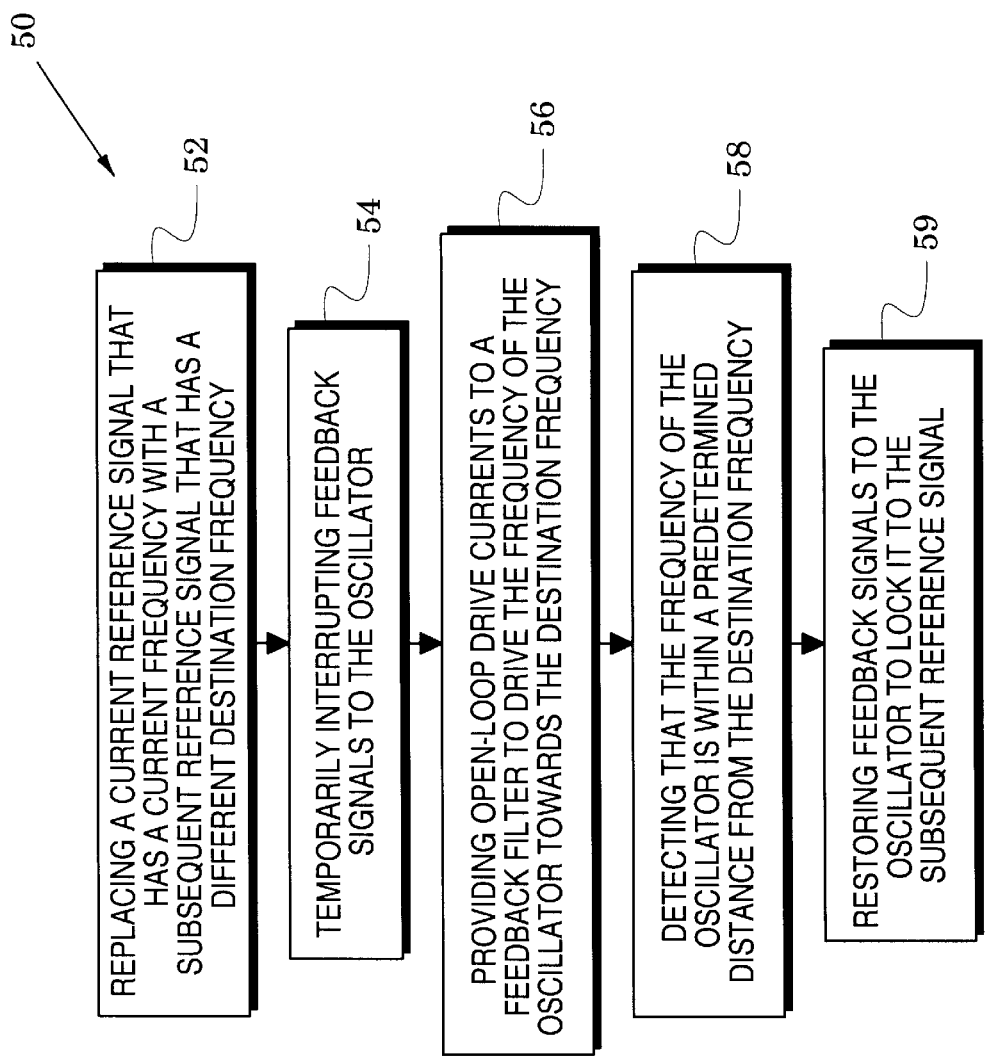
FIG. 2 is flow chart that illustrates a feedback control method of the present invention.

The above-described processes are summarized in the flow chart 50 of FIG. 2 in which a first process step 52 replaces a current reference signal that has a current frequency with a subsequent reference signal that has a destination frequency. In process step 54, feedback signals to the oscillator are then temporarily interrupted and open-loop drive currents are provided to a loop filter in process step 56 to thereby drive the frequency of the oscillator towards the destination frequency.

In process step 58, the frequency of the oscillator is detected so as to determine when it is within a predetermined distance from the destination frequency. In response, feedback signals are restored to the oscillator in process step 59 to lock it to the subsequent reference signal.

Although not shown in FIG. 2, process step 59 is preferably accompanied by a step of terminating the open-loop drive currents that rapidly urged the frequency of the feedback signal (35 in FIG. 1) towards the destination frequency. In addition, the restoring step 59 of FIG. 2 may include the steps of a) configuring the feedback signals to provide an initial wideband feedback loop and b) subsequently reconfiguring the feedback signals to provide a subsequent narrowband feedback loop.

In another method embodiment of the invention, the fast-lock processor (40 in FIG. 1) eliminates the open-loop state from the method described above when the frequency distance between the current reference signal and the subsequent reference signal (i.e., distance between the current frequency and the destination frequency) is below a predetermined threshold. This threshold is preferably set to determine when the VCO signal is within the loop's acquisition range. In such cases, locking time will not be substantially improved by placing the system in its open-loop state and, accordingly, the system is placed directly into its wide-bandwidth closed-loop state.

When the systems of the invention are used with appropriate variable frequency sources (e.g., a direct digital synthesizer), subsequent frequencies may be programmed as digital tuning words. In these cases, the controller 39 of FIG. 1 may compare the programmed frequencies to determine when the open-loop state should be bypassed.

In another method embodiment of the invention, the system inserts additional operational states between the wide-bandwidth state and the narrow-bandwidth state to thereby progressively narrow the control loop bandwidth in multiple steps as the loop settles into phase lock.

In another method embodiment of the invention, a predetermined time delay (e.g., a predetermined number of clock cycles) is inserted before the fast-lock processor 40 of FIG. 1 responds to monitor signals from the phase lock detector 36 that indicate an "out-of-lock" condition. This embodiment effectively filters out system responses to spurious and random "out-of-lock" signals. Additional spurious loop signals may be eliminated by inserting predetermined time delays before the system accepts and acts upon monitor signals from the phase lock detector 36 that indicate an "in-lock" condition. This embodiment filters out system responses to spurious and random "in-lock" signals.

Figure 3A:
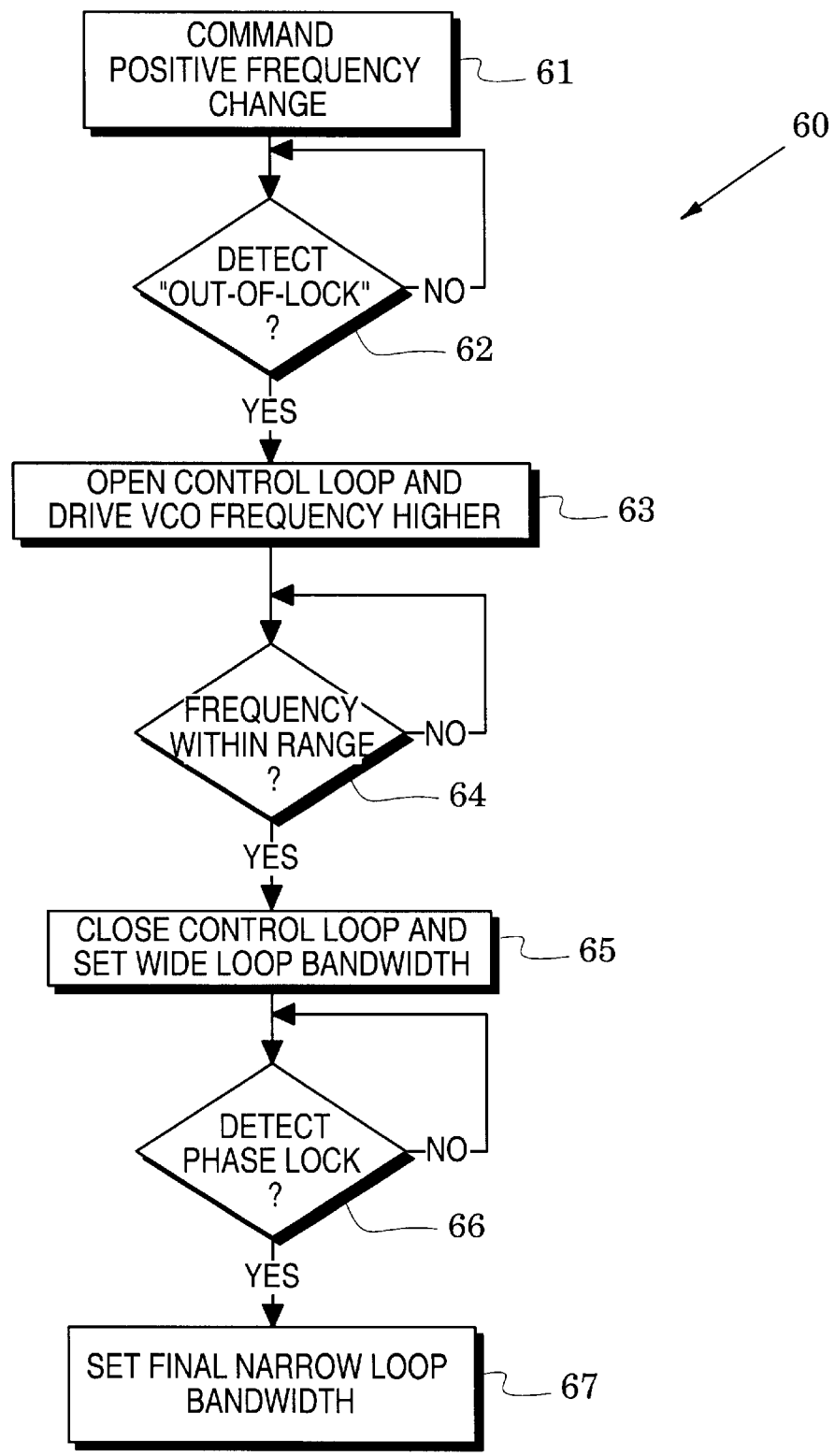
FIGS. 3A and 3B are flow charts that add detailed steps to the flow chart of FIG. 2.
Figure 3B:
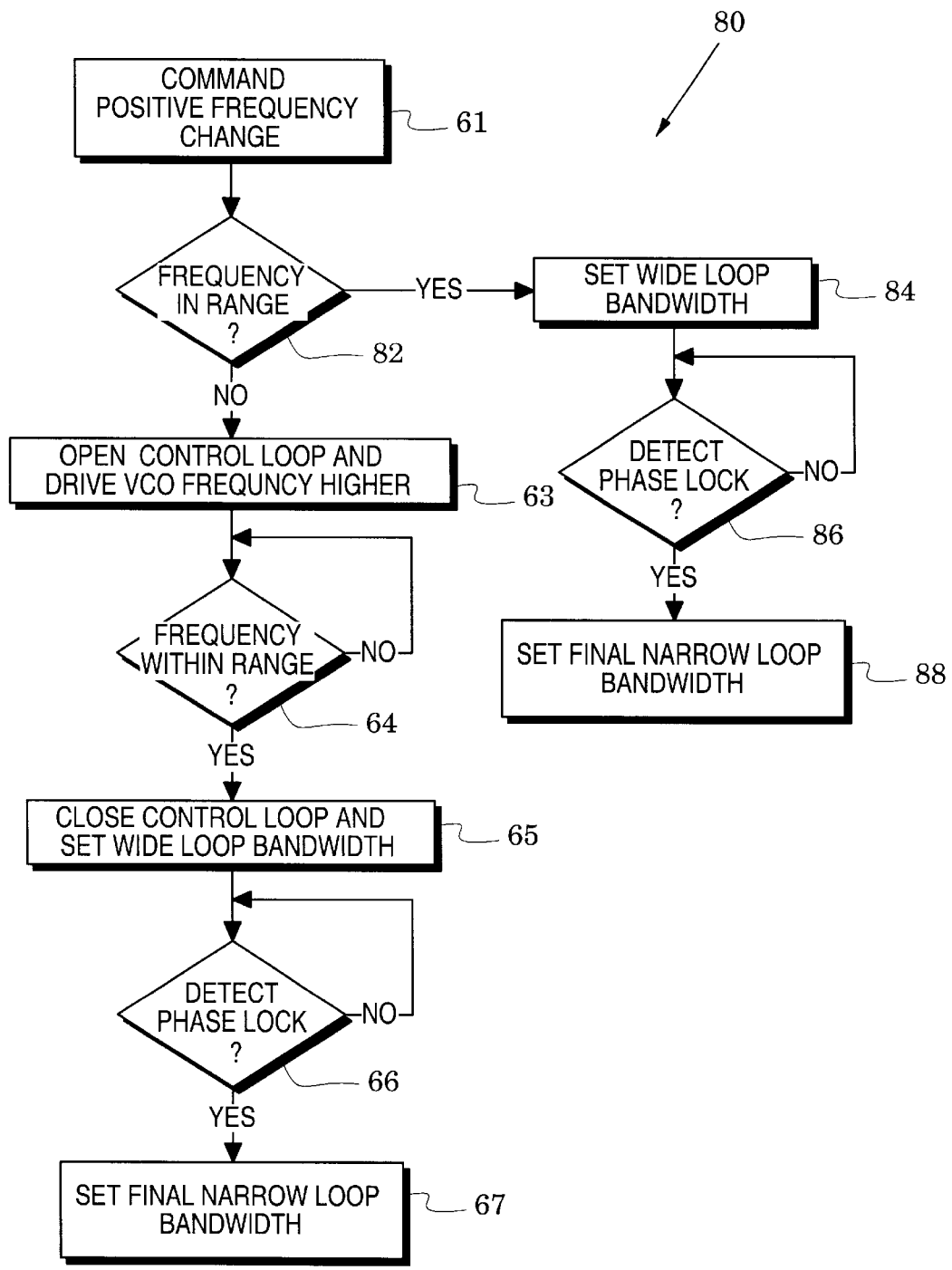
Figure 4:
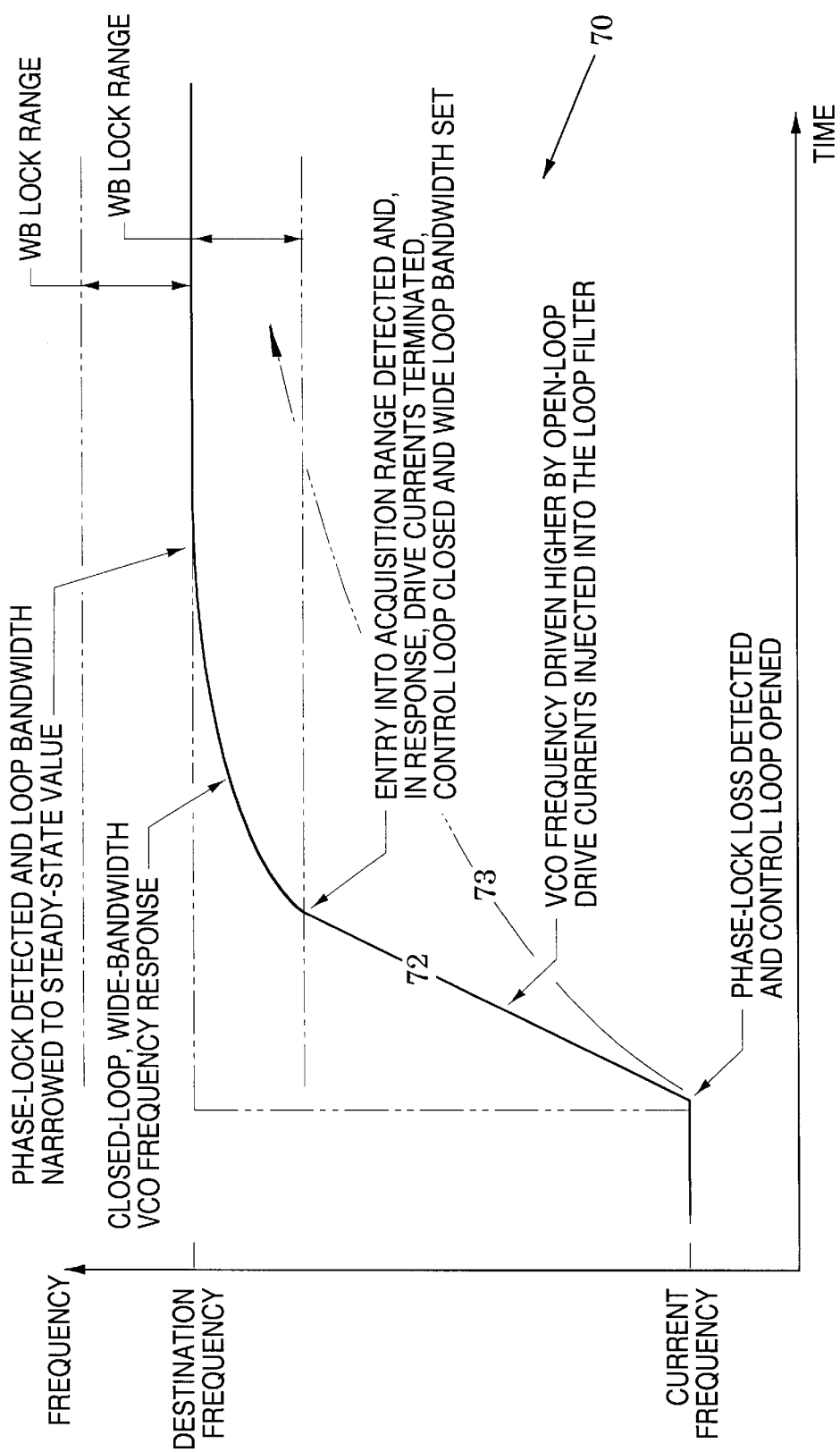
FIG. 4 is a frequency graph that illustrates selected process steps of the invention.

FIGS. 3A and 3B are flow charts which illustrates detailed process steps in method embodiments of the invention and FIG. 4 is a graph that illustrates selected ones of these steps.

In a first process step 61 of FIG. 3A, a positive frequency change (i.e., a higher destination frequency) is commanded (e.g., by control signals 41 from the controller 39 of FIG. 1). Decision 62 is continuously run (e.g., by the phase lock detector 36 of FIG. 1) to detect when the control loop loses lock after which the control loop is opened in process step 63 and the VCO frequency driven higher (e.g., by drive currents of the charge pump 26 of FIG. 1) so that it rapidly approaches the destination frequency. The current frequency and the destination frequency are shown in FIG. 4 as is the moment that loss of lock is detected and the control loop opened. FIG. 4 also shows the VCO frequency being driven higher in response to the open-loop drive currents.

Decision 64 of FIG. 3A is continuously run to establish when the VCO frequency is within a predetermined distance from the destination frequency (as determined, for example, by the fast-lock processor 40 of FIG. 1) after which the control loop is closed in process step 65 and the loop bandwidth set to a wide-bandwidth state. The predetermined distance is shown in FIG. 4 as an acquisition range and the moment is indicated at which the drive currents terminated, the control loop closed and a wide loop bandwidth set. The frequency detection loop (e.g., through the fast-lock processor 40 of FIG. 1) is thus disabled and the phase detection loop (e.g., through the phase detector 24 of FIG. 1) is reestablished.

The wide loop bandwidth is preferably achieved by modifying the loop's charge pump (26 in FIG. 1) with transistor switches or gates, current sources and/or current mirrors to have a transfer function that is increased relative to its steady-state transfer function (i.e., the charge pump is modified to increase its output currents that respond to corresponding control signals from the phase detector). Although the setting of the wide loop bandwidth is shown in FIG. 4 to be synchronous with closing of the control loop, in other embodiments of the invention it may be set at any time subsequent to opening of the control loop and prior to closing of the loop.

Decision 66 of FIG. 3A is then continuously run to establish when the VCO is phase locked (as detected by the phase-lock detector 36 of FIG. 1) after which the loop bandwidth is set to a narrower steady-state value in process step 67. FIG. 4 indicates that the VCO frequency increases at a lesser rate once it has entered the acquisition range and it is responding to feedback signals developed by the closed feedback loop rather than rapidly responding to programmable open-loop drive currents from the charge pump (24 in FIG. 1). FIG. 4 also indicates that phase lock is detected as the feedback frequency (signal 35 in FIG. 1) reaches the destination frequency. In response, the loop bandwidth is narrowed to its steady-state value.

The phase lock detector 36 of FIG. 1 monitors signals from the phase detector 24 and provides the monitor signal 37 which indicates phase lock to the fast-lock processor 40. In different embodiments of the invention, the monitor signal may be adjusted to optimize loop performance. It may be adjusted to indicate phase lock, for example, at a selected time between a time just prior to phase lock (to enhance locking speed) and a point just after phase lock (to allow a loop settling time).

The teachings of the invention thus drive the frequency of the VCO (30 in FIG. 1) along the frequency path 72 of FIG. 4 which rapidly brings it into the acquisition range for rapid subsequent phase lock between the feedback signal (35 in FIG. 1) and the reference signal (23 in FIG. 1). In absence of the invention, the frequency of the VCO (30 in FIG. 1) would respond only to a closed-loop feedback signal and, accordingly, it would slowly approach the destination frequency as indicated by the exemplary broken-line frequency path 73 in FIG. 4.

It is noted that steps similar to those of FIG. 3A would be followed if process step 61 commanded a negative frequency change (i.e., a lower destination frequency). In this case, the control loop is opened in process step 63 and the VCO frequency is driven lower so that it approaches the destination frequency. In FIG. 4, the acquisition range would then be approached from above rather than from below (as shown in FIG. 4).

The flow chart 80 of FIG. 3B illustrates process steps in another method embodiment of the invention that includes process steps 61 and 63–67 of the flow chart 60 of FIG. 3A. In FIG. 3B, however, it is assumed that the command 61 is supplied to the fast-lock processor (40 in FIG. 1) so that there is no need to sense an out-of-lock condition. Instead, loss of phase lock is assumed and decision 62 of FIG. 3A is replaced with decision 82 that decides (e.g., with the fast-lock processor 40 of FIG. 1) if the feedback frequency is within a predetermined range such as the acquisition range of FIG. 4. If the answer is negative, the flow chart 80 proceeds through the same process steps 63–67 of the flow chart 60 of FIG. 3A.

If the answer is positive, it is not necessary to open the feedback control loop (i.e., time to regain phase lock would not be substantially improved) and the flow chart 80 proceeds to process step 84 which places the system in a wide-bandwidth closed-loop state. Decision 86 is then continuously run to establish when the VCO is phase locked after which the loop bandwidth is set to a narrower steady-state value in process step 88.

In the system and method embodiments above, it was assumed that the feedback network (34 in FIG. 1) did not alter the frequency of the VCO's output signal. Accordingly, the output signal 31 was compared in the phase detector 24 to the current and subsequent reference signals 23 of the variable frequency source 22.

When the feedback network 34 is configured to alter the VCO's frequency (e.g., with a frequency divider or a mixer), it is, however, the altered frequency (represented by the feedback signal 35) that is compared to the current and subsequent reference signals of the variable frequency source 22. It is apparent that each altered frequency corresponds to a respective output signal frequency.

It was stated above that the feedback control loop is modified, in the wide-bandwidth state of the invention, to have a loop bandwidth that is increased relative to its steady-state bandwidth. An exemplary closed-loop frequency response is $$I_{cp}(1/s)K_{vco}H(s)/(1+I_{cp}(1/s)K_{vco}H(s)(1/N)) \qquad (1)$$

wherein $I_{cp}$ is charge pump current, $K_{vco}$ is gain of the VCO, H(s) is the loop filter response and N is a divider ratio in the feedback network (7 in FIG. 1). It is apparent from equation (1) that increasing $I_{cp}$ will increase the overall gain and the 0 dB gain crossover point (i.e., the closed-loop bandwidth). The wide-bandwidth modifications of the invention are always configured to maintain a stable closed-loop frequency response.

In realizing the methods of the invention, control portions (e.g., the controller 39 and the fast-lock processor 40 of FIG. 1) of the feedback systems can be realized with hardware elements (e.g., gate systems) and/or with programmable data processors.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A method of locking a feedback signal to a reference signal wherein said feedback signal has a feedback frequency that corresponds to the oscillator frequency of an output signal from an oscillator and said reference signal has a destination frequency, the method comprising the steps of:

opening a feedback control loop that includes said oscillator;

providing an open-loop drive current to a loop filter that is coupled to said oscillator to drive said feedback frequency towards said destination frequency;

detecting that said feedback frequency is within a predetermined acquisition range of said destination frequency; and closing said feedback control loop to lock said feedback signal to said reference signal.

2. The method of claim 1, wherein said closing step includes the step of terminating said drive current.

3. The method of claim 1, wherein said closing step includes the steps of:

initially configuring said feedback control loop to have a first feedback bandwidth; and subsequently reconfiguring said feedback control loop to have a second steady-state feedback bandwidth that is less than said first feedback bandwidth.

4. The method of claim 3, wherein said configuring and reconfiguring steps are realized with a step of revising the transfer function of a charge pump of said feedback control loop.

5. The method of claim 1, wherein said opening step includes the step of disconnecting a phase detector of said feedback control loop from a charge pump of said feedback control loop.

6. The method of claim 1, wherein said providing step includes the step of reconfiguring a charge pump of said feedback control loop to supply said drive current.

7. The method of claim 1, wherein said providing step includes the steps of:

commanding said destination frequency; and with knowledge of said commanding step, providing a control signal that indicates the direction of said drive current.

8. The method of claim 1, wherein said detecting step includes the step of comparing said feedback frequency and said destination frequency.

9. The method of claim 1, wherein said detecting step includes the step of selecting said acquisition range to insure phase lock by a closed feedback control loop.

10. The method of claim 1, wherein said closing step includes the step of reconnecting a phase detector of said feedback control loop to a charge pump of said feedback control loop.

11. The method of claim 1, wherein said feedback frequency equals said oscillator frequency.

12. A method of changing the feedback frequency of a feedback signal from a current frequency to a subsequent destination frequency wherein said feedback frequency corresponds to the oscillator frequency of an output signal from an oscillator, the method comprising the steps of:

with a feedback control loop that includes said oscillator, locking said feedback signal to a reference signal that has said current frequency;

revising said reference signal to have said destination frequency;

temporarily opening said feedback control loop;

providing an open-loop drive current to a loop filter that is coupled to said oscillator to drive said feedback frequency towards said destination frequency;

detecting that said feedback frequency is within a predetermined acquisition range of said destination frequency; and closing said feedback control loop to lock said feedback signal to said reference signal.

13. The method of claim 12, wherein said closing step includes the step of terminating said drive current.

14. The method of claim 12, wherein said closing step includes the steps of:

initially configuring said feedback control loop to have a first feedback bandwidth; and subsequently reconfiguring said feedback control loop to have a second steady-state feedback bandwidth that is less than said first feedback bandwidth.

15. The method of claim 14, wherein said configuring and reconfiguring steps are realized with a step of revising the transfer function of a charge pump.

16. The method of claim 12, wherein said providing step includes the step of reconfiguring a charge pump of said feedback control loop to supply said drive current.

17. The method of claim 12, wherein said locking step includes the step of providing said reference signal with a variable frequency source and said revising step includes the step of commanding said variable frequency source to change the frequency of said reference signal from said current frequency to said destination frequency.

18. The method of claim 12, wherein said feedback frequency equals said oscillator frequency.

19. A feedback control system, comprising:

a voltage-controlled oscillator;

a feedback control loop that generates a feedback signal with a feedback frequency in response to said oscillator; and a processor that:

a) opens said feedback control loop in response to a reference signal that changes from a current frequency to a destination frequency;

b) initiates an open-loop drive current that drives said feedback frequency towards said destination frequency;

c) detects when said feedback frequency is within a predetermined acquisition range of said destination frequency; and d) closes said feedback control loop to lock said feedback signal to said reference signal.

20. The system of claim 19, wherein said processor terminates said drive current when said feedback frequency is within said acquisition range.

21. The system of claim 19, wherein said feedback control loop, in response to its closing, initially defines a first feedback bandwidth and subsequently defines a second steady-state feedback bandwidth that is less than said first feedback bandwidth.

22. The system of claim 21, wherein said feedback control loop includes a loop charge pump whose transfer function is altered to realize said first and second feedback bandwidths.

23. The system of claim 19, wherein said feedback control loop includes:

a loop phase detector; and a loop charge pump;

and wherein said processor disconnects said phase detector and said charge pump to thereby open said feedback control loop.

24. The system of claim 19, wherein said feedback control loop includes a loop charge pump that supplies said drive current.

25. The system of claim 19, wherein said processor determines the direction of said drive current in response to a control signal.

26. The system of claim 19, wherein said processor compares said reference signal and said feedback signal and determines when said feedback frequency is within said acquisition range.

27. The system of claim 19, wherein said feedback control loop includes:

a loop phase detector that receives said reference signal and said feedback signal; and a loop charge pump coupled between said loop phase detector and said oscillator;

and wherein said processor disconnects and reconnects said phase detector and said loop charge pump to thereby open and close said feedback control loop.

28. The system of claim 19, further including a variable frequency source that provides said reference signal and wherein said processor commands said variable frequency source to change the frequency of said reference signal from said current frequency to said destination frequency.

29. The system of claim 19, wherein said feedback control loop includes:

a loop phase detector that responds to said reference signal and said feedback signal; and a feedback network that couples said oscillator and said phase detector and that generates said feedback signal in response to said oscillator.

30. The system of claim 19, wherein said processor includes a gate system.

* * * * *